(12) United States Patent
Ito et al.

(10) Patent No.: US 7,538,585 B2
(45) Date of Patent: May 26, 2009

(54) TRANSCONDUCTOR

(75) Inventors: Rui Ito, Chigasaki (JP); Tetsuro Itakura, Nerima-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 22 days.

(21) Appl. No.: 11/847,503

(22) Filed: Aug. 30, 2007

(65) Prior Publication Data

US 2008/0143434 A1    Jun. 19, 2008

(30) Foreign Application Priority Data

Dec. 14, 2006    (JP)    ............................ P2006-337534

(51) Int. Cl.
*H02M 11/00*    (2006.01)
*H03F 3/45*    (2006.01)
(52) U.S. Cl. .................. 327/103; 327/534; 327/535
(58) Field of Classification Search ................ 327/103, 327/560–563, 534, 535; 330/252, 253
See application file for complete search history.

(56) References Cited

U.S. PATENT DOCUMENTS

| 4,734,654 | A  | * | 3/1988 | Fernandez ................... 330/277 |
| 6,873,209 | B2 |   | 3/2005 | Takata et al. |
| 2002/0067191 | A1 | * | 6/2002 | Asam ......................... 327/115 |
| 2008/0061878 | A1 |   | 3/2008 | Kurose et al. |

FOREIGN PATENT DOCUMENTS

| JP | 55-166312 | 12/1980 |
| JP | 04-192703 | 7/1992 |
| JP | 2004-343277 | 12/2004 |

OTHER PUBLICATIONS

Mathew et al, CMOS Vertical Multiple Independent Gate Field Effect Transistor (MIGFET), IEEE International SOI Conference, 2004, Oct. 2004, pp. 187-189.
Koike et al, XDXMOS: A Novel Technique for Double-Gate MOSFETs Logic Circuits, IEEE 2005 Custom Integrated Circuits Conference, pp. 247-250.
Wang et al, A Voltage-Controllable Linear MOS Transconductor Using Bias Offset Technique, IEEE Journal of Solid-State Circuits, Feb. 1990, vol. 25, No. 1, pp. 315-317.

* cited by examiner

*Primary Examiner*—Tuan T Lam
*Assistant Examiner*—Daniel Rojas
(74) *Attorney, Agent, or Firm*—Turocy & Watson, LLP

(57) ABSTRACT

Disclosed is a transconductor including: first and second transistors each having first and second gates, the first and second gates being independently controlled, differential voltage input being supplied between the one first gate and the other first gate, the one source and the other source being connected, a first control voltage being commonly given to both of the second gates, and the drains being differential current output terminals; third and fourth transistors each having the same connection as the first and second transistors, each of the one drain and the other drain being connected with either of the one drain and the other drain of the first and the second transistors so that polarities are opposite to each other; and a current source connected with both of the sources of the first and the second transistors and both of the sources of the third and the fourth transistors.

6 Claims, 4 Drawing Sheets nMOS TRANSISTOR nMOS TRANSISTOR

TRANSCONDUCTOR

CROSS-REFERENCE TO THE RELATED APPLICATIONS

This application is based upon and claims the benefit of priority from the prior Japanese Patent Application No. 2006-337534, filed on Dec. 14, 2006; the entire contents of which are incorporated herein by reference.

BACKGROUND OF THE INVENTION

1. Field of the Invention

The present invention relates to a transconductor with consideration given to linearity of input-output characteristics.

2. Description of the Related Art

A transconductor having MOS transistors as an input differential pair generally does not have linearity in input-output characteristics, and requires the approach for obtaining linearity. For example, in the technique disclosed in Zhenhua Wang and Walter Guggenbuhl: "A Voltage-Controllable Linear MOS Transconductor Using Bias Offset Technique", IEEE JOURNAL OF SOLID-STATE CIRCUITS, VOL. 25, NO. 1, Feb. 1990, the second differential pair in which a differential-input voltage is inputted by being level-shifted is provided in addition to the first differential pair in which the differential-input voltage is inputted, and both of them are connected so that polarities from the differential voltage input to differential current outputs of them are opposite from each other, whereby linearity is enhanced. This configuration cancels out the nonlinearity which the first differential pair has by the nonlinearity which the second differential pair has, but has the circuit which performs level shift, and increases power consumption correspondingly.

Meanwhile, a planar type is the main stream of the structure of the present MOS transistors, and in the planar type, the channel is controlled by one gate. With microfabrication of transistors, a leak current between drains and sources has become a problem, and the leak current is a current leaking through a substrate even when the voltage between the gate and source is sufficiently lower than the threshold voltage. This prevents power saving. The leak current is caused by the phenomenon called punch through in the short channel effect.

On the other hand, it is known that by adopting the structure capable of controlling a channel with a plurality of gates, the effect of suppressing punch through can be obtained. The transistors having two gates are called Dual-gate FinFETs. Of such transistors, the one capable of individually controlling two gates is disclosed in "CMOS Vertical Multiple Independent Gate Field Effect Transistor (MIGFET)"; Mathew, L. et. al.; SOI Conference, 2004; Proceedings. 2004 IEEE International; 4-7 Oct. 2004 Page(s): 187-189. This document further describes that the threshold value voltage can be made variable with the second gate.

BRIEF SUMMARY OF THE INVENTION

A transconductor that is an aspect of the present invention includes: first and second transistors each having a first gate, a second gate, a source, and a drain, the first gate and the second gate being independently controlled, differential voltage input being supplied between the one first gate and the other first gate, the one source and the other source being connected, a first control voltage being commonly given to the one second gate and the other second gate, and the one drain and the other drain being differential current output terminals; third and fourth transistors each having a first gate, a second gate, a source, and a drain, the first gate and the second gate being independently controlled, the differential voltage input is supplied between the one first gate and the other first gate, the one source and the other source being connected, a second control voltage that differs from the first control voltage being commonly given to the one second gate and the other second gate, and each of the one drain and the other drain being connected with either of the one drain and the other drain of the aforesaid first and second transistors so that polarities from the differential voltage input to the differential current output terminals are opposite to each other; and a current source connected with both of the one source and the other source of the first and the second transistors and both of the one source and the other source of the third and the fourth transistors.

DETAILED DESCRIPTION OF THE INVENTION

Description of Embodiments

Although embodiments of the present invention are described with reference to the drawings, these drawings are provided for only illustrative purpose, and do not restrict the invention in any way.

According to a transconductor according to one mode, third and fourth transistors are provided in addition to first and second transistors, and all of these transistors are transistors having the first and the second gates that can be independently controlled. This can prevent power consumption by a leak current. In the first and the second transistors, a first control voltage is given to both the second gates, and in the third and the fourth transistors, a second control voltage differing from the first control voltage is given to both of the second gates.

By the first and the second control voltages, the threshold value voltages can be made to differ between the first and second transistors and the third and fourth transistors. In addition, the first and second transistors and the third and fourth transistors are connected so that the input/output polarities are opposite in the first and second transistors and the third and fourth transistors, and therefore, nonlinearity of the first and second transistors can be cancelled out by nonlinearity of the third and fourth transistors. Further, the circuit for level shift is not required, and power is saved.

As a form in the above described one mode, a first voltage source generating a voltage to be the first control voltage, and a second voltage source generating a voltage to be the second control voltage may be further included, and at least one of the first voltage source and the second voltage source can be made a variable voltage source. According to such a configuration, transconductance (voltage-current conversion gain) is made variable, and the polarity of transconductance can be reversed.

Further, as a form, a voltage source having a positive voltage terminal and a negative voltage terminal, and a differential amplifier circuit which regards a voltage at the positive voltage terminal and a voltage at the negative voltage terminal as a differential voltage input, generates a voltage to be the first control voltage at one of differential voltage output terminals, and generates a voltage to be the second control voltage at another of the differential voltage output terminals can be further included. According to such a configuration, the possibility of making transconductance variable and reversing the polarity of transconductance can be obtained. If the voltage source is a variable voltage source here, these are possible by making the voltage of the variable voltage source variable.

Figure 1A:
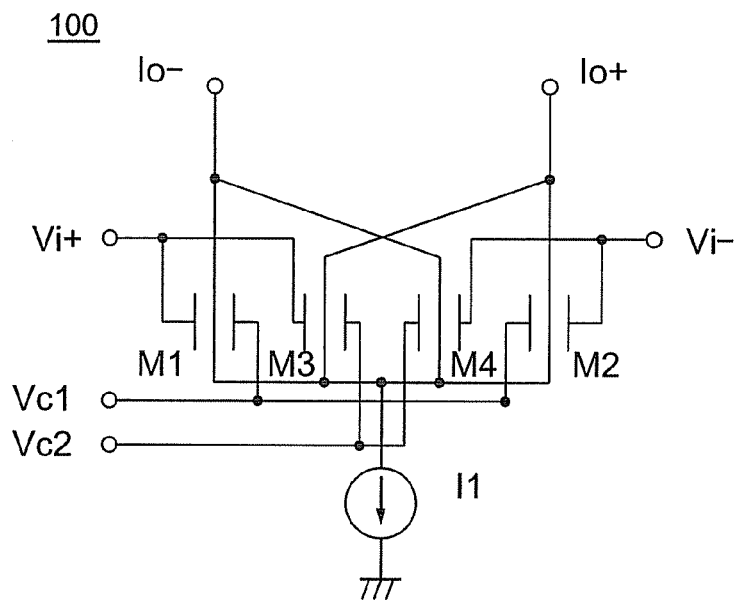
FIGS. 1A, 1B, 1C and 1D are respectively circuit diagrams (FIGS. 1A, 1B and 1C) showing the configuration of a transconductor according to one embodiment and a schematic view (FIG. 1D) showing a schematic structure of a transistor to be used.

On the basis of the above, embodiments will be described with reference to the drawings hereinafter. FIGS. 1A, 1B, 1C and 1D show the configuration of a transconductor according to one embodiment (FIGS. 1A, 1B and 1C), and a schematic structure of a transistor used for this (FIG. 1D). As shown in FIG. 1A, a transconductor 100 has dual gate n-channel MOS transistors M1 and M2 which are a differential pair, dual gate n-channel MOS transistors M3 and M4 which are another pair, and a current source I1 (also called nMOS in place of "n-channel MOS" hereinafter).

Figure 1B:
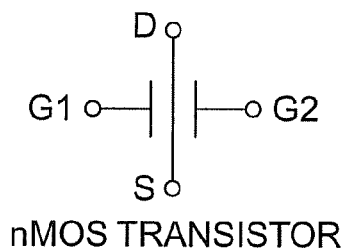
Figure 1C:
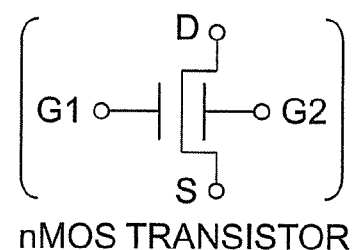
Figure 1D:
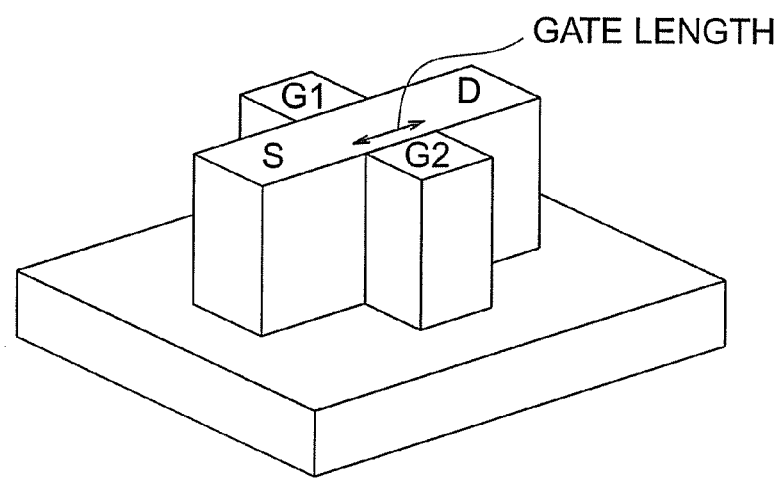

In FIG. 1A, the dual gate nMOS transistors M1, M2, M3 and M4 are expressed by using the symbol shown in FIG. 1B. As the transistor having the same meaning as the symbol shown in FIG. 1B, the expression shown in FIG. 1C is sometimes used. The expression of the transistor having dual gates is the same with respect to each of embodiments which will be described later.

The dual gate nMOS transistors M1, M2, M3 and M4 each has two electrodes G1 and G2 as a gate. They can be independently controlled from an external. In this case, the schematic structure of the transistors M1, M2, M3 and M4 are as shown in, for example, FIG. 1D. Namely, they are not planar type transistors, but a source region, a drain region, a first gate region and a second gate region are formed on a substrate to be in the columnar shapes respectively, and a channel region is provided between the source region and the drain region. The channel region is configured to be controlled by the gate G1 and the gate G2.

As shown in FIG. 1A, the transistors M1 and M2 are the input differential pair as the transconductor 100, and one gates of them are respectively differential voltage input terminals (Vi+, Vi−). The sources are commonly connected to the current source I1. The drains are respectively differential current output terminals (Io+, Io−) as the transconductor 100. A control voltage Vc1 can be commonly applied to the other gates of them. Here, transconductance (voltage-current conversion gain) by the transistors M1 and M2 which are the differential pair is not high in linearity from the general characteristics from the gate-to-source voltage to the drain current in the MOS transistor.

Thus, the transconductor 100 has the configuration that cancels out nonlinearity of the MOS transistors M1 and M2 by the transistors M3 and M4 which are the other differential pair. First, the transistors M3 and M4 are the differential pair having the differential voltage input in common with the transistors M1 and M2. The sources are commonly connected to the current source I1 as the transistors M1 and M2. The drains are connected to the differential current output terminals (Io+, Io−) so that the input/output polarity from the differential voltage input is opposite from that of the transistors M1 and M2. A control voltage Vc2 can be applied to the other gates of them.

In the transconductor 100 of such a configuration, both phases of input to two differential pair transistors can be made from the same nodes, and for example, a level shift circuit for changing the input direct-current voltage level of one differential pair from the input direct-current voltage level of the other differential pair is not needed. Therefore, power is saved correspondingly. In addition, since the dual gate transistors are used, leak current accompanying microfabrication of the transistor structure can be prevented. Also in this respect, the transconductor is advantageous in power saving.

The action of canceling out the nonlinearity of the MOS transistors M1 and M2 by the transistors M3 and M4 which are the other differential pair can be generally described as follows. The transistors M1 and M2 can change the threshold voltage by the control voltage Vc1 which is applied to the other gates of them. The transistors M3 and M4 can change the threshold voltage by the control voltage Vc2 which is applied to the other gates of them. The output characteristics from the gate-to-source voltage to the drain current of the MOS transistor are square characteristics with the threshold voltage subtracted, as is well-known.

When the threshold voltages differ in the transistors M1 and M2 of the one differential pair and the transistors M3 and M4 of the other differential pair, the currents with the reverse characteristics are added in such an input voltage range as the drain current is outputted in both the differential pairs. Namely, in this input voltage range, the action by which the nonlinearity is cancelled out can be obtained. When the control voltages Vc1 and Vc2 are changed respectively, the input voltage range with such an action shifts, and the transconductance changes according to the conditions of the control voltages Vc1 and Vc2 at that time. In the extreme, if the vc1 and vc2 are reversed from each other as voltages, the polarity of the transconductor is reversed.

As in the above description, according to the transconductor of this embodiment, power can be saved and linearity can be enhanced. In the above, the embodiment is described as the transconductor, but it is obvious that if proper loads are respectively connected to the differential current output terminals (Io+, Io−), a differential amplifier circuit for voltage input and voltage output can be obtained. Power saving and linearity improvement are also realized in such a differential amplifier circuit. In embodiments which will be described hereinafter, a differential amplifier circuit can be similarly configured.

Figure 2:
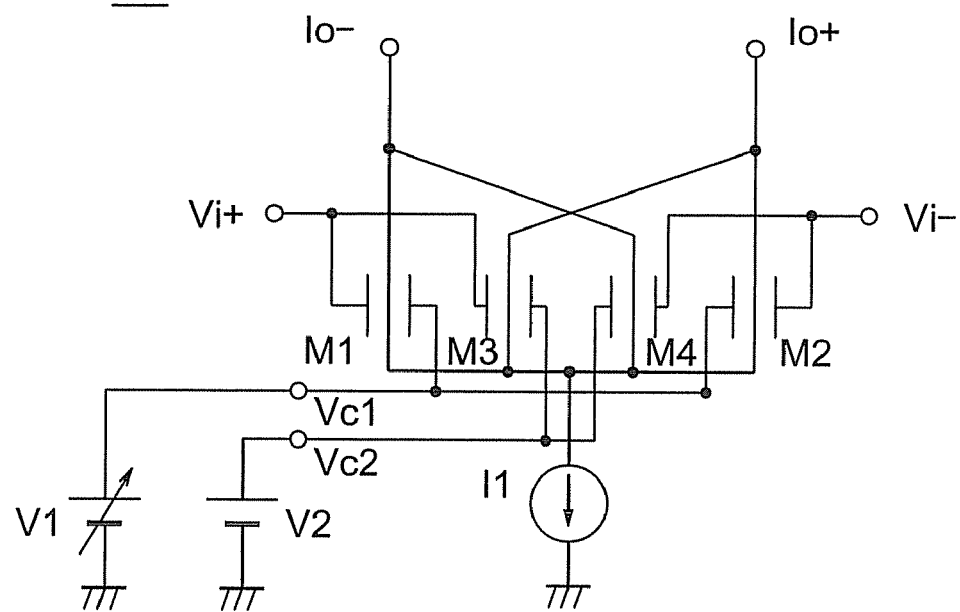
FIG. 2 is a circuit diagram showing the configuration of a transconductor according to another embodiment.

Next, FIG. 2 shows a configuration of a transconductor according to another embodiment. In FIG. 2, the same components as those shown in FIG. 1A are assigned with the same reference numerals and characters, and the explanation of them will be omitted.

A transconductor 200 of this embodiment has the configuration including in advance a direct-current voltage source V1 for outputting the control voltage Vc1 which controls the other gates of the transistors M1 and M2 of the differential pair, and a direct-current voltage source V2 for outputting the control voltage Vc2 which controls the other gates of the transistors M3 and M4 of the differential pair. Of them, the voltage source V1 is made a variable voltage source, and by changing this, transconductance can be made variable.

If the output voltage value of the voltage source V1 is made variable over and under the output voltage value of the voltage source V2, the polarity of the transconductance can be reversed. The configuration which also makes the voltage source V2 a variable voltage source can be adopted. Further, the voltage values of the voltage sources V1 and V2 can be fixed in accordance with the specifications of the transconductor which is required.

Figure 3:
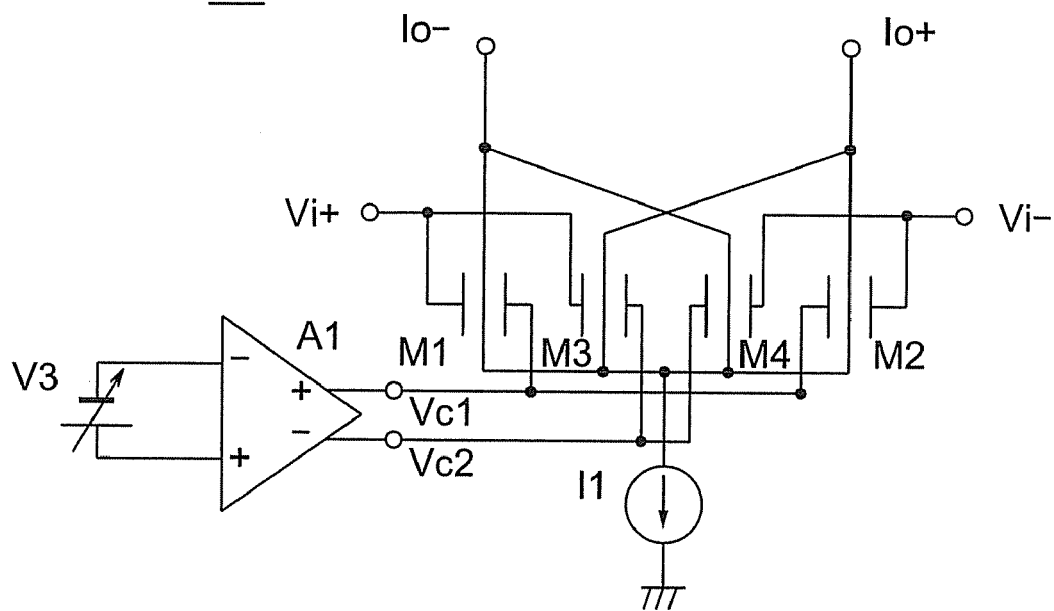
FIG. 3 is a circuit diagram showing the configuration of a transconductor according to still another embodiment.

Next, FIG. 3 shows a configuration of a transconductor according to still another embodiment. In FIG. 3, the same components as those shown in the drawings already explained are assigned with the same reference numerals and characters, and the explanation of them will be omitted. A transconductor 300 of this embodiment has the configuration in which the control voltage Vc1 controlling the other gates of the transistors M1 and M2 of the differential pair and the control voltage Vc2 controlling the other gates of the transistors M3 and M4 of the differential pair are supplied from each of both phases of output of a differential amplifier circuit A1. A variable direct-current voltage source V3 is connected to a differential input of the differential amplifier circuit A1.

Figure 4A:
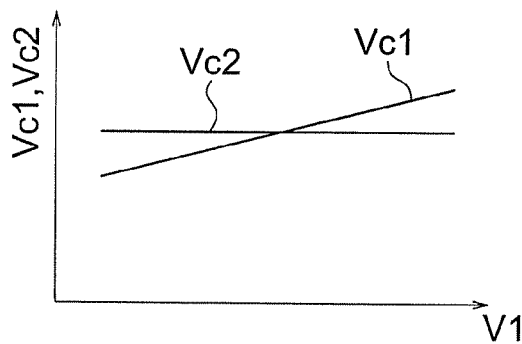
FIGS. 4A and 4B are respectively characteristic charts showing changes in control voltages in the transconductor shown in FIG. 2 or the transconductor shown in FIG. 3.
Figure 4B:
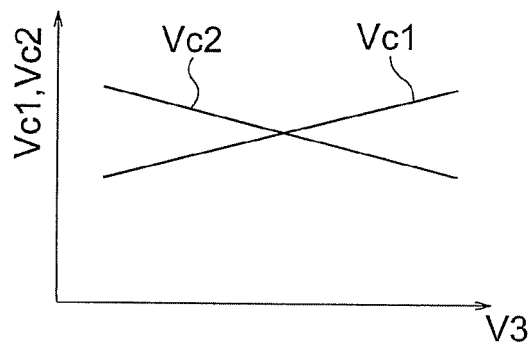

According to such a configuration, changes of the control voltages Vc1 and Vc2 with respect to the change of the output voltage of the voltage source V3 are as shown in, for example, FIG. 4B. Here, for comparison, the characteristic shown in FIG. 4A shows changes of the control voltages Vc1 and Vc2 with respect to the change of the output voltage of the voltage source V1 in the embodiment shown in FIG. 2. As is understood by comparing FIGS. 4A and 4B, in the embodiment shown in FIG. 3, a relative change of each of the control voltages Vc1 and Vc2 can be easily made large. Accordingly, transconductance is easily made variable in a larger range. The voltage value of the voltage source V3 can be fixed in accordance with the specifications of the transconductor which is required.

Figure 5:
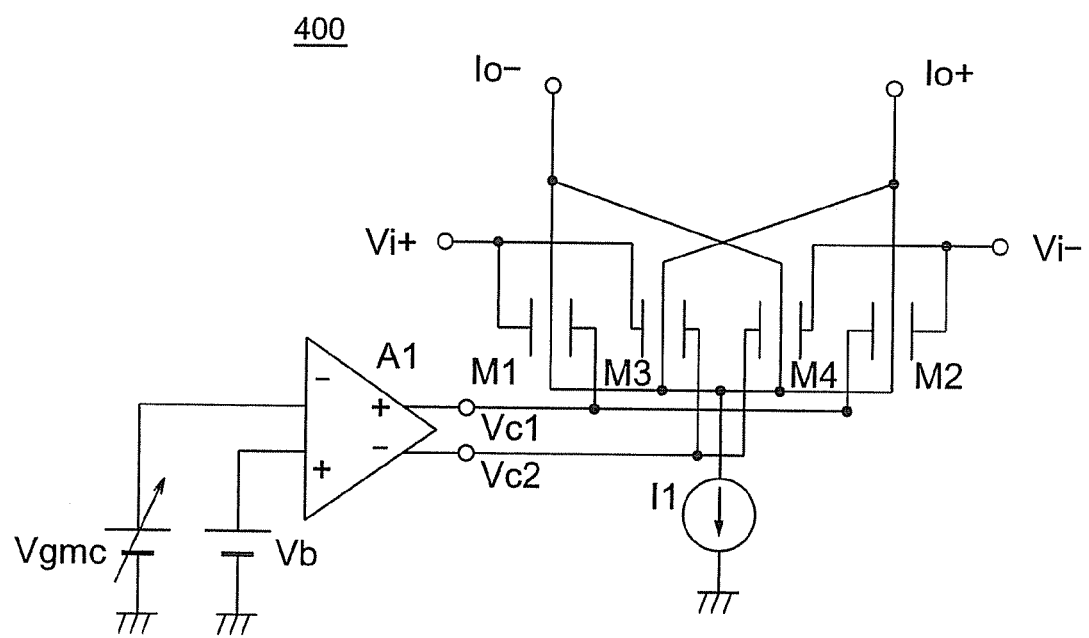
FIG. 5 is a circuit diagram showing the configuration of a transconductor according to yet another embodiment.

FIG. 5 shows a configuration of a transconductor according to yet another embodiment. In FIG. 5, the same components as those shown in the drawings already explained are assigned with the same reference numerals and characters, and the explanation of them will be omitted. A transconductor 400 of this embodiment has the configuration in which the control voltage Vc1 controlling the other gates of the transistors M1 and M2 of the differential pair and the control voltage Vc2 controlling the other gates of the transistors M3 and M4 of the differential pair are supplied from each of both phases of output of the differential amplifier circuit A1 as in the embodiment shown in FIG. 3. A variable direct-current voltage source Vgmc is connected to one of differential inputs of the differential amplifier circuit A1, and a direct-current voltage source Vb is connected to the other one. If at least one of the variable direct-current voltage source Vgmc and the direct-current voltage source Vb is variable, transconductance of the transconductor 400 becomes variable.

Figure 6:
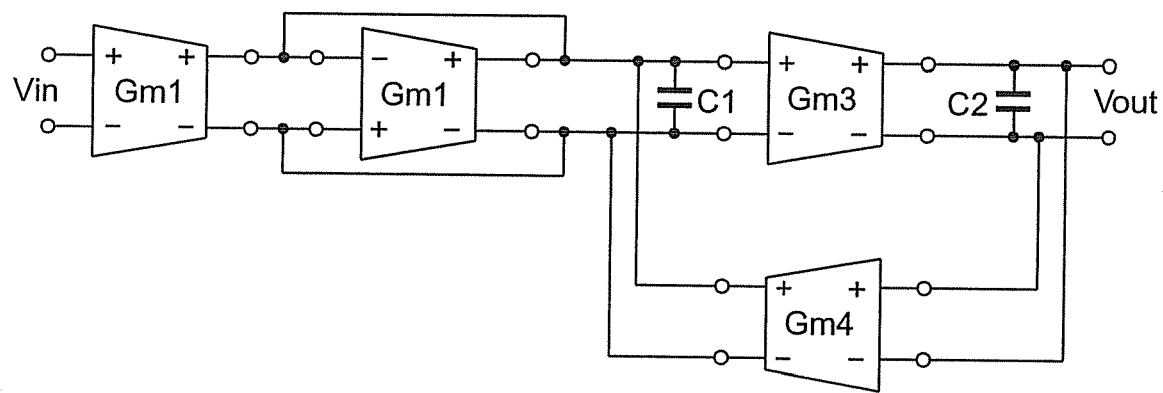
FIG. 6 is a block diagram showing a filter utilizing the transconductor according to each of the embodiments.

The transconductors according to the respective embodiments are described above, and various kinds of filters (LPF, HPF, BPF, BEF and the like) can be configured by using these transconductors as elements. FIG. 6 shows one of such configuration examples. In FIG. 6, each of transconductors Gm1, Gm2, Gm3 and Gm4 corresponds to any of the transconductors in the above described explanation. In FIG. 6, illustration of bias circuits and the like is omitted for simplification of the explanation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A transconductor, comprising:

first and second transistors each having a first gate, a second gate, a source, and a drain, the first and the second gate of the first transistor being independently controlled, the first and the second gate of the second transistor being independently controlled, differential voltage input being supplied between the first gates, the sources being connected with each other, a first control voltage being commonly given to the second gates, and the drains being differential current output terminals;

third and fourth transistors each having a first gate, a second gate, a source, and a drain, the first and the second gate of the third transistor being independently controlled, the first and the second gate of the fourth transistor being independently controlled, the differential voltage input being supplied between the first gates, the sources being connected with each other, a second control voltage that differs from the first control voltage being commonly given to the second gates, and each of the drains being connected with either of the drains of the first and the second transistors so that polarities from the differential voltage input to the differential current output terminals are opposite to each other; and a current source connected with both of the sources of the first and the second transistors and both of the sources of the third and the fourth transistors.

2. The transconductor according to claim 1, further comprising:

a first voltage source generating a voltage to be the first control voltage; and a second voltage source generating a voltage to be the second control voltage, wherein at least one of the first voltage source and the second voltage source is a variable voltage source.

3. The transconductor according to claim 1, further comprising:

a voltage source having a positive voltage terminal and a negative voltage terminal; and a differential amplifier circuit regarding a voltage of the positive voltage terminal and a voltage of the negative voltage terminal as a differential voltage input, configured to generate a voltage to be the first control voltage at one of differential voltage output terminals, and to generate a voltage to be the second control voltage at another of the differential voltage output terminals.

4. The transconductor according to claim 3, wherein the voltage source is a variable voltage source.

5. The transconductor according to claim 1, further comprising:

a first voltage source having a positive voltage terminal and a negative voltage terminal;

a second voltage source having a positive voltage terminal and a negative voltage terminal; and a differential amplifier circuit regarding a voltage of the positive voltage terminal of the first voltage source and a voltage of the positive voltage terminal of the second voltage source as a differential voltage input, configured to generate a voltage to be the first control voltage at one of differential voltage output terminals, and to generate a voltage to be the second control voltage at another of the differential voltage output terminals.

6. The transconductor according to claim 5, wherein at least one of the first voltage source and the second voltage source is a variable voltage source.

\* \* \* \* \*